(12) United States Patent
Kong et al.

(10) Patent No.: US 9,076,951 B2
(45) Date of Patent: *Jul. 7, 2015

(54) METHODS OF INTEGRATING LED CHIPS WITH HEAT SINKS, AND LED-BASED LIGHTING ASSEMBLIES MADE THEREBY

(71) Applicant: Albeo Technologies, Inc., Boulder, CO (US)

(72) Inventors: Ming Kong, Boulder, CO (US); John Powell, Boulder, CO (US); Jeffrey Bisberg, Boulder, CO (US)

(73) Assignee: ALBEO TECHNOLOGIES, INC., Boulder, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/802,444

(22) Filed: Mar. 13, 2013

(65) Prior Publication Data

US 2013/0193463 A1 Aug. 1, 2013

Related U.S. Application Data

(60) Continuation-in-part of application No. 13/718,755, filed on Dec. 18, 2012, now Pat. No. 8,558,255, which is a continuation of application No. 13/287,796, filed on Nov. 2, 2011, now Pat. No. 8,338,197, which is a
(Continued)

(51) Int. Cl.
*H01L 27/15* (2006.01)
*H01L 31/12* (2006.01)
(Continued)

(52) U.S. Cl.
CPC ............ *H01L 33/642* (2013.01); *H01L 33/005* (2013.01); *H01L 25/0753* (2013.01);
(Continued)

(58) Field of Classification Search
CPC .......... H01L 33/00; H01L 33/08; H01L 33/26; H01L 51/0032
USPC .............. 257/79, 98, 668, 675, 706, E31.127, 257/E33.001
See application file for complete search history.

(56) References Cited

U.S. PATENT DOCUMENTS

| 4,729,076 A | 3/1988 | Masami et al. |
| 4,814,667 A | 3/1989 | Tanaka |

(Continued)

OTHER PUBLICATIONS

File history from related U.S. Appl. No. 13/287,796 dated May 17, 2012 through Dec. 5, 2012, 17 pages.

(Continued)

*Primary Examiner* — Hoai V Pham
(74) *Attorney, Agent, or Firm* — GE Global Patent Operation; Peter T. DiMauro

(57) ABSTRACT

An LED-based lighting assembly includes a heat sink having at least one pedestal with an upwardly facing, upper planar surface that is raised in a vertical direction relative to an upwardly facing, lower planar surface of the heat sink. A PCB forms an aperture corresponding to the pedestal, includes electrical conductors on an upper surface thereof, and is attached to the lower planar surface. The upper planar surface extends into the aperture, and one or more LED chips attach directly to the upper planar surface and connect to the conductors such that light emits upwardly. A method of integrating LEDs with a heat sink includes mounting a PCB to a planar surface of the heat sink, mounting one or more LED chips to a raised surface of the heat sink that is not covered by the PCB, and electrically connecting the LED chips to conductors on the PCB.

7 Claims, 8 Drawing Sheets

Related U.S. Application Data division of application No. 12/857,472, filed on Aug. 16, 2010, now Pat. No. 8,058,659, which is a continuation-in-part of application No. 12/198,662, filed on Aug. 26, 2008, now Pat. No. 7,791,089.

(60) Provisional application No. 61/234,309, filed on Aug. 16, 2009.

(51) Int. Cl.

| | | |
|---|---|---|
| *H01L 33/00* | (2010.01) | |
| *H01L 33/64* | (2010.01) | |
| *H01L 33/62* | (2010.01) | |
| *H05K 1/02* | (2006.01) | |
| *H05K 1/18* | (2006.01) | |
| *H01L 25/075* | (2006.01) | |
| *H01L 33/54* | (2010.01) | |
| *H01L 33/60* | (2010.01) | |
| *H05K 1/05* | (2006.01) | |
| *H05K 3/00* | (2006.01) | |

(52) U.S. Cl.
CPC ............... *H01L 33/54* (2013.01); *H01L 33/60* (2013.01); *H01L 33/62* (2013.01); *H05K 1/056* (2013.01); *H01L 2224/48091* (2013.01); *H01L 2224/48137* (2013.01); *H01L 2224/73265* (2013.01); *H05K 1/021* (2013.01); *H05K 1/185* (2013.01); *H05K 3/0061* (2013.01); *H05K 2201/09063* (2013.01); *H05K 2201/10106* (2013.01)

(56) References Cited

U.S. PATENT DOCUMENTS

| | | |
|---|---|---|
| 5,082,422 A | 1/1992 | Wang |
| 5,113,232 A | 5/1992 | Itoh et al. |
| 5,119,174 A | 6/1992 | Chen |
| 5,136,483 A | 8/1992 | Schoniger et al. |
| 5,241,360 A | 8/1993 | Key et al. |
| 5,278,432 A | 1/1994 | Ignatius et al. |
| 5,283,425 A | 2/1994 | Imamura |
| 5,534,718 A | 7/1996 | Chang |
| 5,785,418 A | 7/1998 | Hochstein |
| 5,857,767 A | 1/1999 | Hochstein |
| 6,045,240 A | 4/2000 | Hochstein |
| 6,354,714 B1 | 3/2002 | Rhodes |
| 6,561,678 B2 | 5/2003 | Loughrey |
| 6,568,833 B2 | 5/2003 | Worgan et al. |
| 6,590,343 B2 | 7/2003 | Pederson |
| 6,609,804 B2 | 8/2003 | Nolan et al. |
| 6,894,901 B2 | 5/2005 | Simon |
| 6,982,518 B2 | 1/2006 | Chou et al. |
| 6,999,318 B2 | 2/2006 | Newby |
| 7,023,341 B2 | 4/2006 | Stilp |
| 7,033,036 B2 | 4/2006 | Pederson |
| 7,114,831 B2 | 10/2006 | Popovich et al. |
| 7,170,100 B2 | 1/2007 | Erchak et al. |
| 7,196,459 B2 | 3/2007 | Morris |
| 7,201,511 B2 | 4/2007 | Moriyama |
| 7,236,366 B2 | 6/2007 | Chen |
| 7,252,408 B2 | 8/2007 | Mazzochette et al. |
| 7,274,043 B2 | 9/2007 | Erchak et al. |
| 7,303,315 B2 | 12/2007 | Ouderkirk et al. |
| 7,309,151 B2 | 12/2007 | Mok et al. |
| 7,311,423 B2 | 12/2007 | Frecska et al. |
| 7,344,284 B2 | 3/2008 | Lynam et al. |
| 7,348,604 B2 | 3/2008 | Matheson |
| 7,358,929 B2 | 4/2008 | Mueller et al. |
| 7,476,557 B2 | 1/2009 | Daniels et al. |
| 7,507,001 B2 | 3/2009 | Kit |
| 7,549,773 B2 | 6/2009 | Lim |
| 7,569,420 B2 | 8/2009 | Tung |
| 7,626,208 B2 | 12/2009 | Yang et al. |
| 2002/0093832 A1 | 7/2002 | Hamilton |
| 2003/0048641 A1 | 3/2003 | Alexanderson et al. |
| 2003/0189829 A1 | 10/2003 | Shimizu et al. |
| 2004/0105264 A1 | 6/2004 | Spero |
| 2004/0184272 A1 | 9/2004 | Wright et al. |
| 2004/0264141 A1 | 12/2004 | Spryshak |
| 2004/0264195 A1* | 12/2004 | Chang et al. .................. 362/294 |
| 2005/0085011 A1 | 4/2005 | Lee |
| 2005/0099810 A1 | 5/2005 | Tasson et al. |
| 2005/0157469 A1 | 7/2005 | Gorak |
| 2005/0243556 A1 | 11/2005 | Lynch |
| 2005/0287050 A1 | 12/2005 | Rabellino et al. |
| 2006/0139932 A1 | 6/2006 | Park |
| 2006/0186423 A1 | 8/2006 | Blonder et al. |
| 2006/0251259 A1 | 11/2006 | Renkis |
| 2006/0278808 A1 | 12/2006 | Hick et al. |
| 2007/0081340 A1 | 4/2007 | Chung |
| 2007/0115665 A1 | 5/2007 | Mueller et al. |
| 2007/0121326 A1 | 5/2007 | Nall et al. |
| 2007/0222369 A1 | 9/2007 | Yoshino et al. |
| 2007/0230185 A1 | 10/2007 | Shuy |
| 2007/0247851 A1 | 10/2007 | Villard |
| 2007/0259160 A1 | 11/2007 | Huang |
| 2007/0268703 A1 | 11/2007 | Gasquet et al. |
| 2007/0273290 A1 | 11/2007 | Ashdown et al. |
| 2007/0291490 A1 | 12/2007 | Tajul et al. |
| 2008/0007954 A1 | 1/2008 | Li |
| 2008/0055896 A1 | 3/2008 | Feldmeier |
| 2008/0137308 A1 | 6/2008 | MacDonald et al. |
| 2008/0137325 A1 | 6/2008 | Pastore |
| 2008/0144291 A1 | 6/2008 | Hu |
| 2008/0158887 A1 | 7/2008 | Zhu |
| 2008/0170371 A1 | 7/2008 | Lai |
| 2008/0170380 A1 | 7/2008 | Pastore |
| 2008/0174969 A1 | 7/2008 | Sandwall |
| 2008/0186682 A1 | 8/2008 | Sugimura |
| 2008/0192458 A1 | 8/2008 | Li |
| 2008/0205054 A1 | 8/2008 | Ho |
| 2008/0224849 A1 | 9/2008 | Sirhan |
| 2009/0267085 A1 | 10/2009 | Lee et al. |
| 2010/0133555 A1 | 6/2010 | Negley |
| 2010/0244056 A1 | 9/2010 | Ray et al. |
| 2011/0175512 A1* | 7/2011 | Lai .................. 313/46 |

OTHER PUBLICATIONS

U.S. Appl. No. 12/198,662, Notice of Allowance mailed Jul. 7, 2010, 8 pages.
Select file history of related U.S. Appl. No. 12/198,662, from Jul. 7, 2010 through Nov. 9, 2010, 23 pages.
Select file history of related U.S. Appl. No. 12/857,472, from Mar. 16, 2011 through Oct. 26, 2011, 36 pages.
U.S. Appl. No. 12/843,194 Rule 312 Amendment dated Apr. 6, 2011, 3 pages.
U.S. Appl. No. 12/843,194 Response to Rule 312 Amendment dated Apr. 12, 2011, 2 pages.
U.S. Appl. No. 12/843,194 Notice of Allowance dated Mar. 21, 2011, 10 pages.
U.S. Appl. No. 12/897,593, Response to Office Action filed Mar. 28, 2011, 7 pages.
U.S. Appl. No. 12/897,593, Office Action mailed Feb. 8, 2011, 7 pages.
U.S. Appl. No. 12/897,593, Notice of Allowance mailed Jun. 20, 2011, 9 pages.
U.S. Appl. No. 13/718,755, Notice of Allowance mailed Jun. 10, 2013, 13 pages.
U.S. Appl. No. 13/802,401 Office Action dated May 22, 2014, 13 pages.
U.S. Appl. No. 13/802,401 Response to Office Action filed Oct. 22, 2014, 9 pages.
U.S. Appl. No. 13/802,401 Notice of Allowance dated Nov. 4, 2014, 9 pages.

* cited by examiner

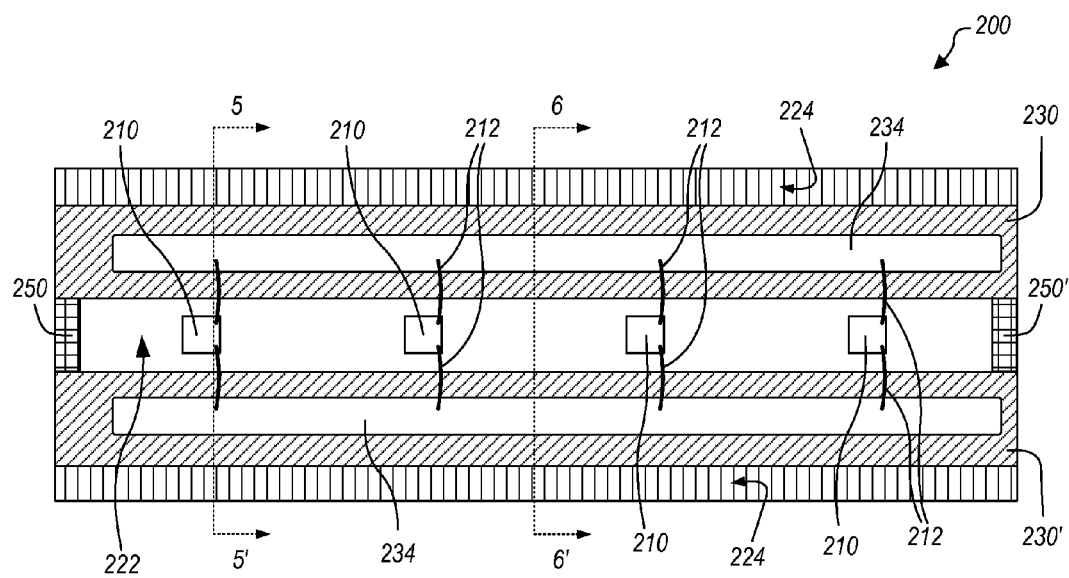
FIG. 4
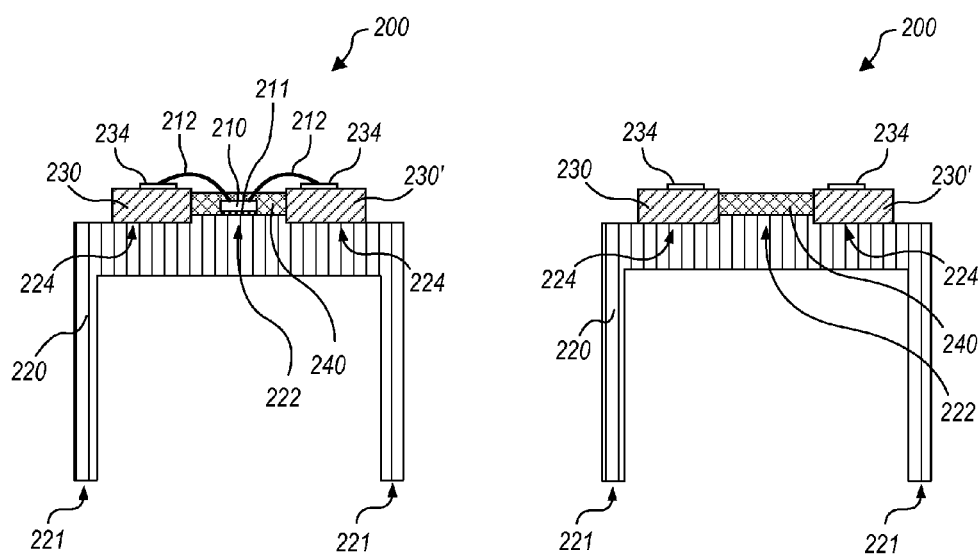
FIG. 5  FIG. 6

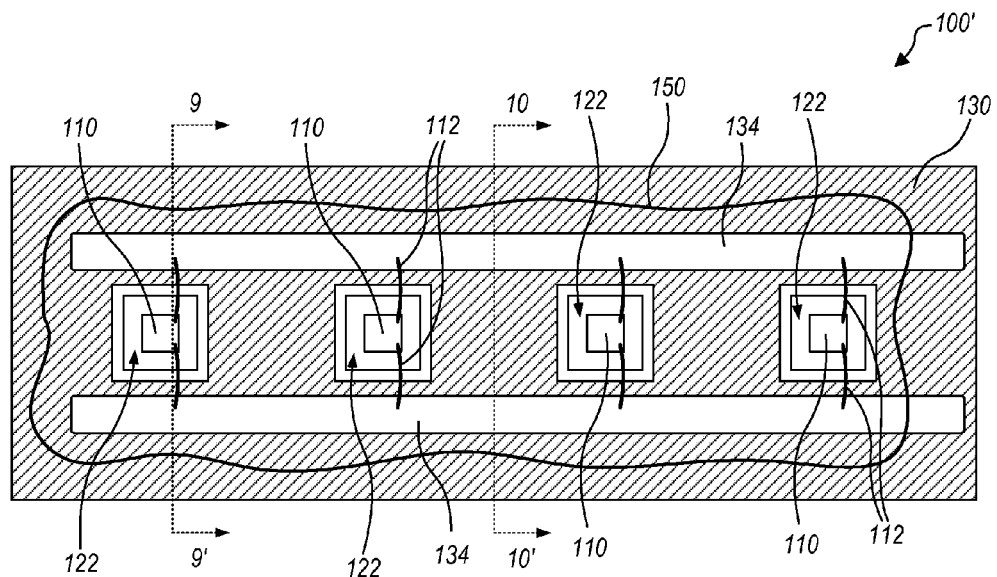
FIG. 8
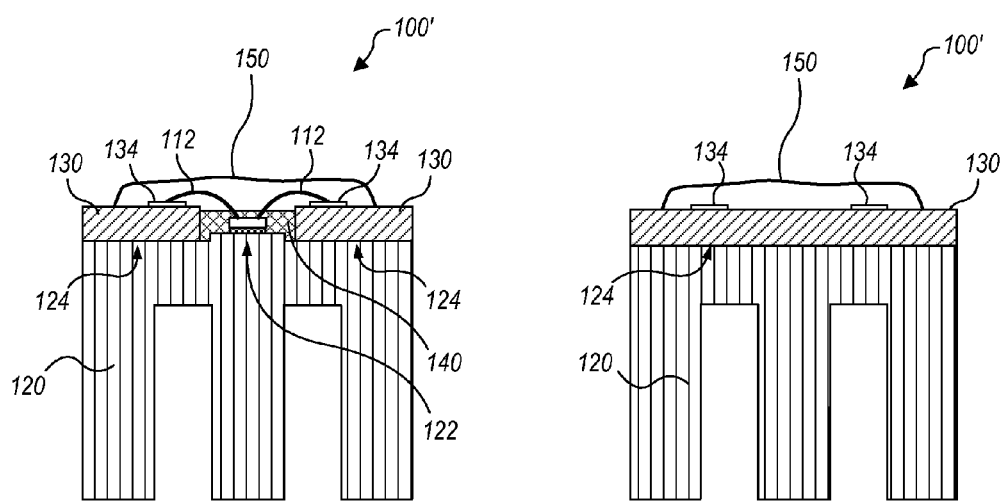
FIG. 9  FIG. 10

METHODS OF INTEGRATING LED CHIPS WITH HEAT SINKS, AND LED-BASED LIGHTING ASSEMBLIES MADE THEREBY

CROSS REFERENCE TO RELATED APPLICATIONS

This application is a continuation-in-part application of U.S. patent application Ser. No. 13/718,755, filed 18 Dec. 2012 and entitled "LED Chip-Based Lighting Products and Methods of Building," which is a continuation application of U.S. patent application Ser. No. 13/287,796, filed 2 Nov. 2011 and entitled "LED Chip-Based Lighting Products and Methods of Building," now U.S. Pat. No. 8,338,197, which is a divisional application of U.S. patent application Ser. No. 12/857,472, filed 16 Aug. 2010 and entitled "LED Chip-Based Lighting Products and Methods of Building," now U.S. Pat. No. 8,058,659, which is a continuation-in-part application of U.S. patent application Ser. No. 12/198,662, filed 26 Aug. 2008 and entitled "LED Packaging Methods and LED-Based Lighting Products," now U.S. Pat. No. 7,791,089. U.S. patent application Ser. No. 12/857,472 also claims priority to U.S. Patent Application Ser. No. 61/234,309, filed 16 Aug. 2009 and entitled "LED Chip-Based Lighting Products and Methods of Building." All of the above-identified patent applications are incorporated by reference herein in their entireties.

BACKGROUND

Present day lighting apparatus typically mounts packaged light-emitting diodes (LEDs) to printed circuit boards (PCBs) that are sometimes fabricated of so-called epoxy glass, typically a fiberglass mesh encapsulated in an epoxy binder. However, epoxy glass substrates have thermal conductivities in the range of about 0.25 to 0.6 W/(m° K.), such that they are not particularly good thermal conductors, The low thermal conductivity of PCBs can make removal of heat generated by the LEDs problematic.

SUMMARY

In an embodiment, a light emitting diode (LED)-based lighting assembly includes: a heat sink having at least one pedestal integrally formed therewith, the pedestal including an upwardly facing, upper planar surface that is raised in a vertical direction relative to an upwardly facing, lower planar surface of the heat sink; a printed circuit board (PCB) forming an aperture therein corresponding to the pedestal, the PCB including electrical conductors on an upper surface thereof, the PCB being attached to the lower planar surface such that the upper planar surface extends into the aperture; and one or more LED chips attached directly to the upper planar surface and electrically connected to the conductors such that light from the one or more LED chips emits upwardly from the upper planar surface.

In an embodiment, a light emitting diode (LED)-based lighting assembly includes: a heat sink configured with an extruded ridge that extends vertically from a planar surface of the heat sink; a printed circuit board (PCB) that includes electrical conductors on an upper surface thereof, the PCB being attached to the planar surface; and one or more LED chips, each of the LED chips being (a) attached directly to the ridge and (b) electrically connected to the conductors.

In an embodiment, a method of integrating a light emitting diodes (LEDs) with a heat sink includes mounting a printed circuit board (PCB) to a planar surface of the heat sink, mounting one or more LED chips to a raised surface of the heat sink that is not covered by the PCB, and electrically connecting the LED chips to conductors on the PCB.

In an embodiment, a light emitting diode (LED)-based lighting assembly includes: a heat sink having at least one pedestal integrally formed therewith, the pedestal including an upwardly facing, upper planar surface that is raised in a vertical direction relative to an upwardly facing, lower planar surface of the heat sink; a dielectric layer forming an aperture therein corresponding to the pedestal, the dielectric layer being attached to the lower planar surface such that the upper planar surface extends into the aperture; at least one electrical conductor formed on an upper surface of the dielectric layer; and one or more LED chips attached directly to the upper planar surface and connected to the electrical conductor such that light from the one or more LED chips emits upwardly from the upper planar surface.

In an embodiment, a light emitting diode (LED)-based lighting product includes: a panel having a first surface and a second surface counterfacing the first surface, at least part of the second surface forming an external surface of the lighting product; a dielectric layer that covers a portion of the first surface, the dielectric layer forming apertures therein such that the first surface is exposed within the apertures; at least one electrical conductor formed on an upper surface of the dielectric layer; and one or more LED chips attached to the first surface and electrically connected with the at least one electrical conductor.

BRIEF DESCRIPTION OF DRAWINGS

FIG. 4 schematically illustrates an LED assembly that includes LED chips integrated with a heat sink, in an embodiment.

FIG. 5 is a cross-sectional illustration of the LED assembly along line 5-5' shown in FIG. 4.

FIG. 6 is a cross-sectional illustration of the LED assembly along line 6-6' shown in FIG. 4.

FIG. 8 schematically illustrates an LED assembly that includes LED chips integrated with a heat sink, in an embodiment.

FIG. 9 is a cross-sectional illustration of the LED assembly along line 9-9' shown in FIG. 8.

FIG. 10 is a cross-sectional illustration of the LED assembly along line 10-10' shown in FIG. 8.

DETAILED DESCRIPTION OF DRAWINGS

Figure 1:
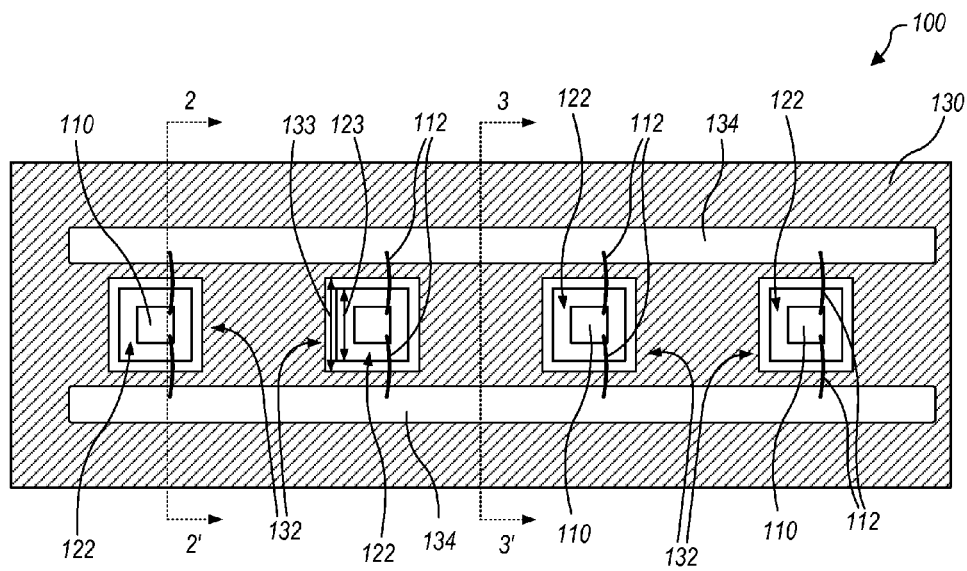
FIG. 1 schematically illustrates an LED assembly that includes LED chips integrated with a heat sink, in an embodiment.

The present disclosure may be understood by reference to the following detailed description taken in conjunction with the drawings briefly described below. It is noted that, for purposes of illustrative clarity, certain elements in the drawings may not be drawn to scale.

Figures 2, 3:
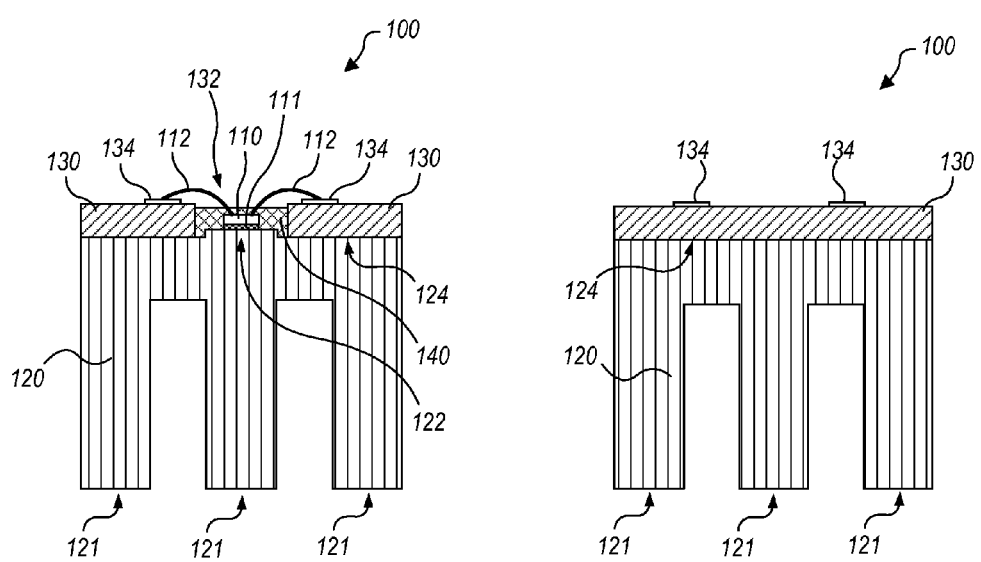
FIG. 2 is a cross-sectional illustration of the LED assembly along line 2-2' shown in FIG. 1.
FIG. 3 is a cross-sectional illustration of the LED assembly along line 3-3' shown in FIG. 1.

FIGS. 1, 2 and 3 schematically illustrate one embodiment of a light emitting diode (LED) assembly. LED assembly 100 includes LED chips 110 mounted upon a heat sink 120. Herein, a "heat sink" is defined as a monolithic structure formed of a good or excellent thermal conductor that includes a base portion that includes a mounting area for components, and at least two fins extending perpendicularly from the base portion in a direction opposite from the mounting area, for dissipating heat generated by the components. A "good thermal conductor" is defined herein as a material having a bulk thermal conductivity of at least 15 W/(m° K.), and an "excellent thermal conductor" is defined herein as a material having a bulk thermal conductivity of at least 100 W/(m° K.). Also, "fins" are defined herein as parts of the heat sink that are formed monolithically with, but extend from, the base portion, and have an aspect ratio in at least one dimension of at least 2:1, with a major dimension of each fin extending away from the base portion. The relationships among the base portion, mounting area, and fins are discussed further below in connection with FIG. 12.

FIG. 1 is a plan view of LED assembly 100, while FIGS. 2 and 3 are cross-sectional views taken at lines 2-2' and 3-3' respectively, in FIG. 1. Heat sink 120 is formed of a good or excellent thermal conductor, and includes three integrally formed fins 121 extending downwardly from a base portion of the heat sink, as shown in FIGS. 2 and 3. A major dimension of each fin 121 is in a vertical direction, and an aspect ratio of each fin 121 is about 2.6:1. Heat sink 120 includes pedestals 122 integrally formed on the base portion, upon which LED chips 110 mount utilizing adhesive 111 (visible in the cross sectional view of FIG. 2, but obscured by LED chips 110 in FIG. 1). In certain embodiments, when heat sink 120 is formed of an electrically conductive material (e.g., a metal), adhesive 111 may be conductive (e.g., electrically conductive epoxy, such as silver filled epoxy) to electrically connect LED chips 110 with heat sink 120. In other embodiments, when heat sink 120 is formed of a nonconductive material that is still a good or excellent thermal conductor (e.g., a ceramic such as alumina), adhesive 111 may be either electrically conductive or electrically nonconductive (e.g., nonconductive epoxy).

LED assembly 100 also includes a printed circuit board (PCB) 130 that forms apertures 132 therethrough, corresponding to each pedestal 122. PCB 130 is generally a dielectric or insulator (such as epoxy fiberglass, sometimes described with the trade name FR4, or a polymer) and may be a conventional circuit board or simply an insulating layer on planar surface 124. PCB 130 typically has a thickness within a range of 0.1 mm to 3 mm (the lower end of this range corresponds to cases wherein PCB 130 is a simple dielectric layer). PCB 130 attaches to planar surface 124 with adhesives, or mechanically (e.g., with screws) (planar surface 124 is obscured by PCB 130 in FIG. 1, but is indicated in FIGS. 2 and 3). PCB 130 also includes electrical conductors 134 on an upper surface thereof, to which LED chips 110 connect with bond wires 112. Bond wires 112 may be formed, for example, of aluminum, gold and/or alloys thereof; in particular, aluminum bond wires 112 are compatible with room temperature processing (e.g., of encapsulation material 140, discussed below). Pedestals 122 may be raised or offset in the vertical direction with respect to a planar surface 124 of heat sink 120, such that a combined height of pedestal 122, LED 110 and adhesive 111 approximately matches a thickness of PCB 130, so that bond wires 112 need not span a large height differential. However, in embodiments an overall height of pedestals 122, adhesive 111 and LED chips 110 is less than a thickness of PCBs 130 to facilitate application of an encapsulation material, as described below. Also, it may be advantageous for dimensions of apertures 132 to closely match dimensions of pedestals 122, to minimize lengths of bond wires 112. In an embodiment, inner dimension 133 of aperture 132 is matched to outer dimension 123 of pedestal 122 such that PCB 130 is within one millimeter of pedestal 122 on all sides thereof.

LED chips 110 may be so-called "face up" LED chips having both anode and cathode connections on top sides thereof, and formed on insulating substrates (e.g., alumina, silicon carbide, aluminum nitride). Thus, LED chips 110 are electrically isolated from heat sink 120. The electrical isolation of LED chips 110 from heat sink 120 also enables use of low cost adhesive 111 for mounting LED chips 110 to pedestals 122. For example, adhesive 111 may be a nonconductive epoxy.

A first, optional, encapsulation material 140 may be utilized to protect LED chips 110. (The cross hatching used to illustrate encapsulation material 140 in FIG. 2 is not shown in FIG. 1 for clarity of illustration, but material 140 would extend across each aperture 132, including on top of LEDs 110.) Material 140 may be dispensed in liquid form, and dried or cured to form a solid or semisolid. Drying or curing materials like encapsulation material 140, whether through heating, application of radiation such as ultraviolet light, or simply by the passage of time shall be referred to herein as "curing." Material 140 may be, for example, silicone, epoxy or acrylic.

As shown in FIG. 2, the height of pedestals 122 and the thickness of LED chips 110 and PCB 130 can be arranged so that a top surface of PCB 130 is higher than a top surface of LED chips 110. The vertical heights of components in FIG. 2 are not drawn to scale; in particular LEDs 110 may be thinner than shown, the height of LED 110 is exaggerated for clarity of illustration. Thus arranged, PCB 130 acts as a dam to contain encapsulation material 140 during operations such as dispense and curing, after which material 140 is dimensionally stable. The ability of PCB 130 to act as a dam is especially advantageous when apertures 132 form closed shapes extending through PCB 130, as shown in FIG. 1. It is also possible to dispense a measured amount of material 140 upon LED chips 110 such that material 140 is held in place by surface tension until cured. Material 140 may be admixed with a phosphor to provide a useful and/or aesthetically pleasing light color (e.g., low wavelength light emitted by LED chips 110 may excite the phosphor, which then emits some of the energy therein as longer wavelength light, to provide an approximation of white light). A height of pedestals 122 may be jointly defined with thicknesses of PCBs 130 and LEDs 110 such that aperture 132 can contain a thickness of material 140 that is adequate to protect LEDs 110 and to provide enough phosphor to provide a desired amount of longer wavelength light. In an embodiment, LEDs 110 are about 0.2 mm thick, PCBs 130 are within a range of 1 to 3 mm thick, and pedestals 122 extend about 1 mm above planar surface 124.

Heat sink 120 is configured for efficient dissipation of heat generated by LED chips 110 to ambient air and/or to other substances or structures. For example, in addition to fins (discussed in connection with FIG. 12), heat sink 120 may couple thermally with a light fixture housing or a liquid cooling system. LED chips 110 benefit from minimal thermal resistance between junctions where heat may be generated, and heat sink 120, since they are bonded directly to one another without any intermediate, low thermal conductivity object (e.g., a PCB) in the thermal dissipation path. That is, the embodiment shown in FIGS. 1-3 has no elements other than adhesive 111 between each LED chip 110 and heat sink 120.

Features in the vicinity of each LED chip 110 may include reflective surfaces to help reflect light emitted by the LED chip outwardly instead of being absorbed. For example, edges of PCB 130 that form apertures 132, and pedestal 122 may include reflective surfaces or coatings to reflect light from LED chips 110 outwardly.

Certain features illustrated in FIGS. 1-3 are exemplary and will be understood as such by one skilled in the art. These features include, but are not limited to, the number, relative sizes and shapes of apertures 132, pedestals 122 and LED chips 110 shown; the layout of PCB 130 on heat sink 120; the routing of conductors 134 upon PCB 130; and the underside structure of heat sink 120.

FIGS. 4, 5 and 6 schematically illustrate another embodiment of a light emitting diode (LED) assembly 200. LED assembly 200 includes LED chips 210 integrated with a heat sink 220. FIG. 4 is a plan view of LED assembly 200, while FIGS. 5 and 6 are cross-sectional views taken at lines 5-5' and 6-6' respectively, in FIG. 4. As noted above, a "heat sink" is defined herein as a monolithic structure formed of a good or excellent thermal conductor, that includes a base portion having a mounting area for components, and at least two fins extending perpendicularly from the base portion in a direction opposite from the mounting area, for dissipating heat generated by the components to ambient air. Heat sink 220 includes two integrally formed fins 221, as shown in FIGS. 5 and 6; a major dimension of each fin 221 is in a vertical direction, and an aspect ratio of each fin 221 is about 8.9:1. Heat sink 220 includes an integrally formed ridge 222, upon which LED chips 210 mount directly, utilizing an adhesive 211; ridge 222 is raised or offset vertically with respect to a planar surface 224 of heat sink 220. Adhesive 211 may be, for example, a nonconductive epoxy. Because ridge 222 and fins 221 are both profiles formed only in two dimensions, heat sink 220 may be formed by extrusion, resulting in a lower manufacturing cost (as compared to heat sink 120 which may be cast or milled to form pedestals 122). LED assembly 200 also includes PCBs 230, 230' mounted adjacent to ridge 222. During manufacturing of assembly 200, PCBs 230 and/or 230' may be positioned against ridge 222, that is, ridge 222 may be utilized as a mechanical stop such that either or both of PCBs 230, 230' abut ridge 222. PCBs 230, 230' may mount to heat sink 220 with adhesives, or mechanically (e.g., with screws). PCBs 230, 230' also include electrical conductors 234 on an upper surface thereof, to which LED chips 210 connect with bond wires 212. Bond wires 212 may be formed, for example, of aluminum, gold and/or alloys thereof; in particular, aluminum bond wires 212 are compatible with room temperature processing.

Like LED chips 110, LED chips 210 may also be so-called "face up" LED chips, and may be formed on insulating substrates. Thus, LED chips 210 can be electrically isolated from heat sink 220 so that low cost materials (e.g., a nonconductive epoxy as adhesive 211) can be used to mount LED chips 110 to ridge 222. LED chips 210 benefit from the same advantageous heat dissipation to heat sink 220 as LED chips 110 dissipating heat to heat sink 120, as discussed above. In particular, the embodiment shown in FIGS. 4-6 has no elements other than adhesive 211 between each LED chip 210 and heat sink 220.

Like optional encapsulation material 140 (FIGS. 1-3), a similar, optional encapsulation material 240 may be utilized to protect LED chips 210. As shown in FIG. 5, the height of ridge 222 and the thickness of LED chips 210, adhesive 211 and PCBs 230, 230' can be arranged so that a top surface of PCBs 230, 230' is higher than a top surface of LED chips 210. Also, optional dam elements 250, 250' may be installed at ends of assembly 200 atop ridge 222. Thus arranged, PCBs 230, 230' and dam elements 250, 250' act as dams to contain material 240 during operations such as dispense and curing, after which material 240 is dimensionally stable. (The cross hatching used to illustrate material 440 in FIGS. 5 and 6 is not shown in FIG. 4 for clarity of illustration, but material 140 would fill the area between PCBs 230, 230' and dam elements 250, 250', including on top of LEDs 210.) If used, dam elements 250, 250' may be removed after material 240 is cured. Like optional encapsulation material 140, it is also possible to utilize a measured amount of material 240 dispensed upon LED chips 210 such that material 240 is held in place by surface tension until cured. Material 240 may be admixed with a phosphor to provide a useful and/or aesthetically pleasing light color.

It should be clear to one skilled in the art that the construction modalities illustrated in FIGS. 1-6 may be adapted to various configurations of LED chips. For example, it is contemplated that routing of conductors 234 upon PCB 230 or 230' could be modified to provide two terminals (e.g., power and ground) for each LED on a single PCB instead of utilizing two PCBs, as shown. In such a case, dam elements 250, 250' could be modified to provide a dam feature enclosing ridge 222 to contain an encapsulant material applied thereto.

Also, in order to increase the light output of an LED assembly, it may be advantageous to connect multiple LED chips as opposed to simply utilizing larger LED chips. Manufacturing yield, heat dissipation and output efficiency of LED chips are typically better for small LED chips than for large LED chips; however, such efficiencies tend to be diluted somewhat by prior art, individual chip packaging processes. The present LED assembly methods and apparatus are advantageously compatible with the multiple LED chip approach, for several reasons. Pedestals and/or ridges upon which LED chips may be mounted can easily provide space for mounting multiple chips. Multiple LED chips connected in series in a light fixture will tend to provide uniform light output for each LED chip as opposed to the case when such chips are connected in parallel. To facilitate this, the present methods provide for certain bond wires of such chips to be arranged chip-to-chip, reducing the total number of connections required, as compared to bonding two terminals of each LED chip out to PCB conductors.

Figure 7:
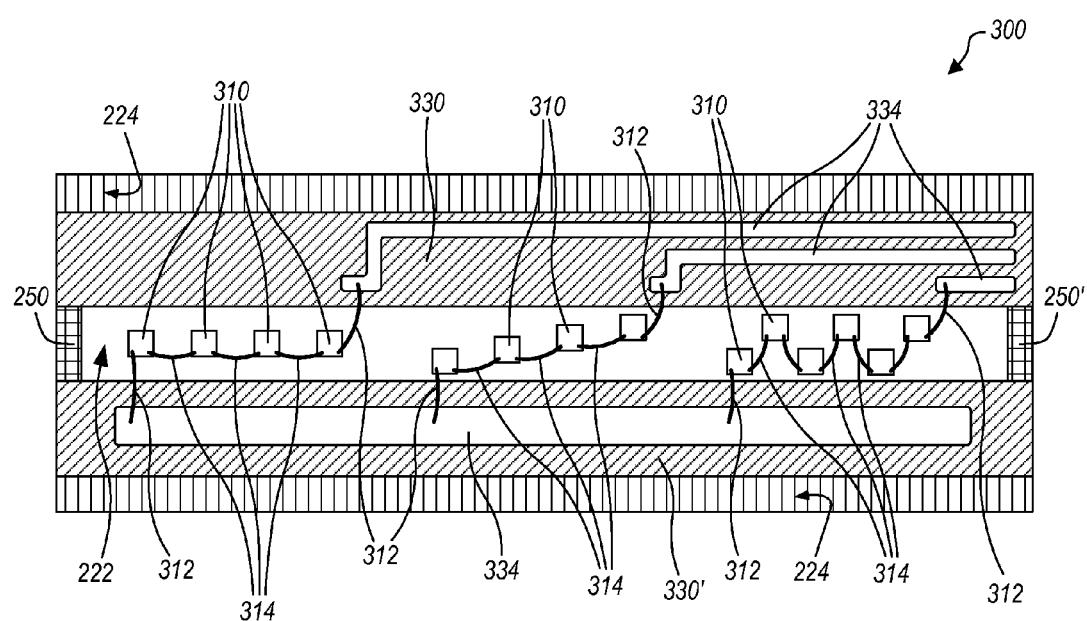
FIG. 7 schematically illustrates an LED assembly that connects several groups of LED chips in series, with separate power routing for each of the groups, in an embodiment.

FIG. 7 schematically illustrates an LED assembly 300 that connects several groups of LED chips 310 in series, with separate power routing for each of the groups. LED assembly 300 integrates LED chips 310 with ridge 222 of heat sink 220. LED assembly 200 also includes PCBs 330, 330' mounted adjacent to ridge 222. PCBs 330, 330' may mount to heat sink 220 with adhesives, or mechanically, and include conductors 334 on an upper surface thereof, to which some of LED chips 310 connect with bond wires 312. LED assembly 300 also includes chip-to-chip bonding, utilizing bond wires 314, as shown. In this "daisy chain" configuration, at least two bond wires 312 connect ends of "chains" of LED chips to conductors 334, while at least one bond wire 312 connects LED chips to one another. Bond wires 312 and/or 314 may be formed of aluminum, gold and/or alloys thereof. Bond wires 312 and 314 may be formed of the same material as one another, but this is not required; forming bond wires 312 and 314 of different materials may be desirable so that the respective wirebonding processes (e.g., chip to chip for wirebonds 314, and chip to PCB for wirebonds 312) can be optimized for best performance, reliability and/or cost. Some instances of LED chips 310 and bond wires 314 are not labeled in FIG. 7, for clarity of illustration.

Like LED chips 110 and 210, LED chips 310 may also be so-called "face up" LED chips, and may be formed on insulating substrates. Thus, LED chips 310 can be electrically isolated from heat sink 220 so that low cost materials can be used to mount LED chips 110 to ridge 222. LED chips 310 benefit from the same advantageous heat dissipation to heat sink 220 as LED chips 110 dissipating heat to heat sink 120, or as LED chips 210 dissipating heat to heat sink 220, discussed above. Also, like optional encapsulation materials 140 and 240, a similar, optional encapsulation material (not shown in FIG. 7, for clarity of illustration) may be utilized to protect LED chips 310. PCBs 330, 330' and optional dam elements 250, 250' act as dams to contain the material during operations such as dispense and curing, after which the material is dimensionally stable. If used, dam elements 250, 250' may be removed after the material is cured. The material may be admixed with a phosphor to provide a useful and/or aesthetically pleasing light color.

FIGS. 8, 9 and 10 schematically illustrate another embodiment of a light emitting diode (LED) assembly. LED assembly 100' includes the same elements as LED assembly 100, FIG. 1, and further includes a second, optional, encapsulation material 150, as shown. Encapsulation material 150 serves to further protect LED assembly 100' as compared to LED assembly 100, especially portions of bond wires 112 and conductors 134 that are not encapsulated in LED assembly 100. Encapsulation material 150 may be, for example, epoxy, silicone or acrylic. Providing encapsulation material 150 separately from material 140 provides the advantage that materials 140 and 150 can be optimized differently for cost and performance purposes. In particular, material 140 may include a phosphor, which may make material 140 costly on a volume basis, but material 150 may exclude phosphor so as to minimize a combined cost of materials 140 and 150. Encapsulation material 150 can also be chosen to provide more rigorous environmental protection than encapsulation material 140. Encapsulation material 150 may be dispensed and cured over areas of LED assembly 100', as shown, without any particular structure for containing material 150 (e.g., material 150 may be held in place merely by surface tension until it cures). Alternatively, dam elements (e.g., like dam elements 250, 250', FIGS. 4-6) may be used temporarily to contain material 150 until it cures, or may remain permanently.

Figure 11:
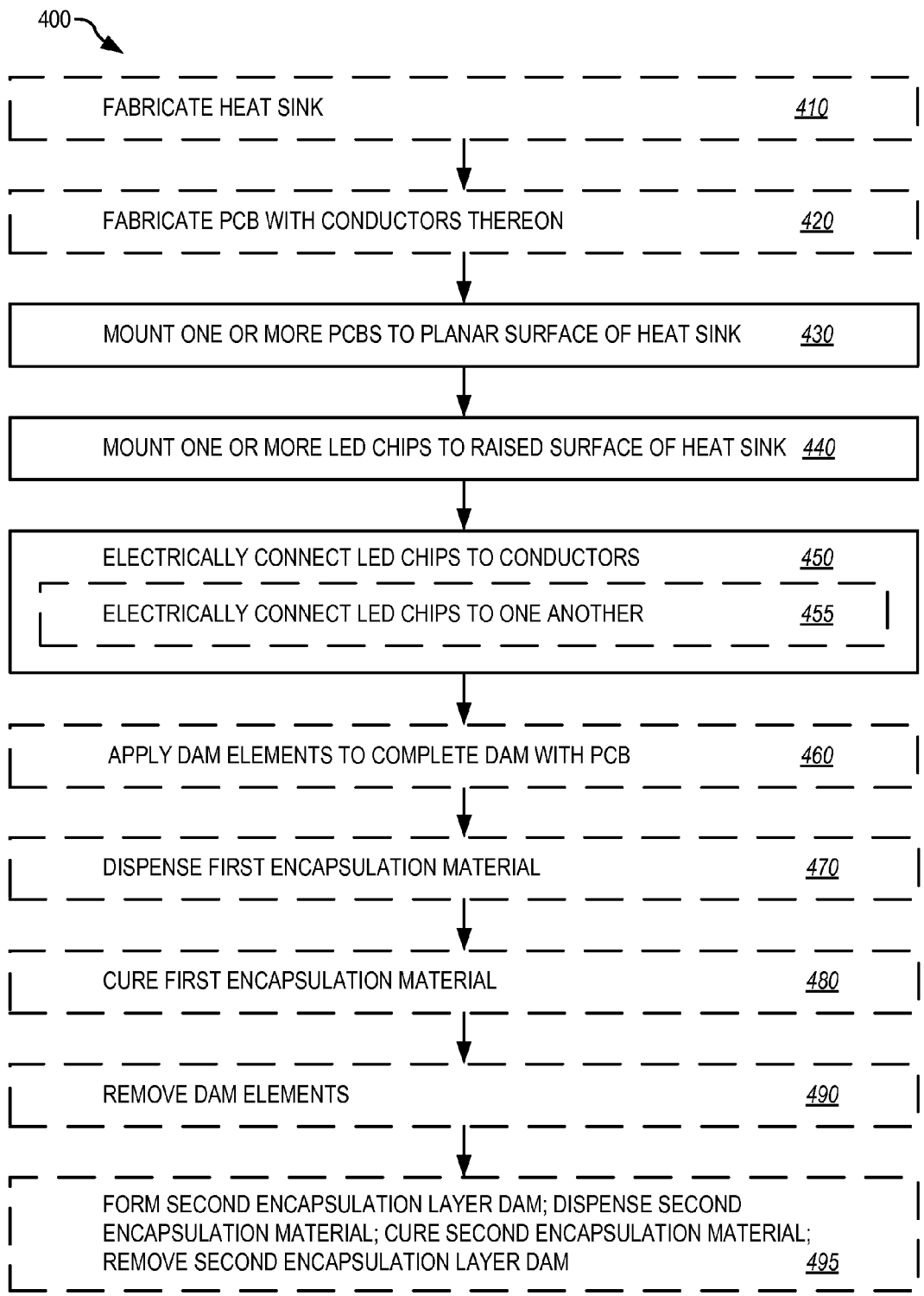
FIG. 11 is a flowchart illustrating a method for making an LED assembly, in an embodiment.

FIG. 11 is a flowchart illustrating a method 400 for making an LED assembly. Optional steps 410 and 420 fabricate a heat sink and a PCB with conductors thereon, respectively. Step 430 mounts one or more PCBs to a planar surface of the heat sink. Examples of step 430 include mounting PCB 130 to surface 124 of heat sink 120 (FIGS. 1-3), and/or mounting PCB 230 (FIGS. 4-6) or PCB 330 (FIG. 7) to surface 224 of heat sink 220. Step 440 mounts one or more LED chips to a raised surface of the heat sink. Examples of step 440 include mounting LED chips 110 to pedestals 122 of heat sink 120 (FIGS. 1-3), mounting LED chips 210 (FIGS. 4-6) or and/or LED chips 310 (FIG. 7) to ridge 222 of heat sink 220. It is contemplated that steps 430 and 440 could be reversed within method 400, that is, the LED chip(s) could be mounted first and the PCB(s) could be mounted afterward. Step 450 electrically connects the LED chips to conductors on the PCBs. Examples of step 450 include electrically connecting LED chips 110 to conductors 134 of PCB 130 (FIGS. 1-3), electrically connecting LED chips 210 to conductors 234 (FIGS. 4-6) and/or electrically connecting LED chips 310 to conductors 334 (FIG. 7). An optional step 455 electrically connects LED chips to one another. An example of step 455 is connecting LED chips 310 to one another with wirebonds 314, FIG. 7.

Another optional step 460 of method 400 applies dam elements to a heat sink in order to complete a dam for an encapsulation material that is partially formed by one or more PCBs. Examples of step 460 include applying dam elements 250, 250' to heat sink 220 to complete a dam that is partially formed by PCBs 230, 230' (FIGS. 4-6) or by PCBs 330, 330' (FIG. 7). Further optional steps 470 and 480 dispense and cure, respectively, an encapsulation material. Examples of steps 470 and 480 are dispensing and curing, respectively, encapsulation material 140 (FIGS. 1-3) or encapsulation material 240 (FIGS. 4-6). Still another optional step 490 removes dam elements, if any, that were previously applied in step 460. Examples of step 490 include removing dam elements 250, 250' from heat sink 220 (FIGS. 4 and 7). Another optional step 495 includes at least dispensing and curing a second encapsulation material; step 495 may also include forming a dam for the second encapsulation material and may include removing the dam after the second encapsulation material is cured. An example of step 495 is dispensing and curing second encapsulation material 150 (FIGS. 8-10).

Figure 12:
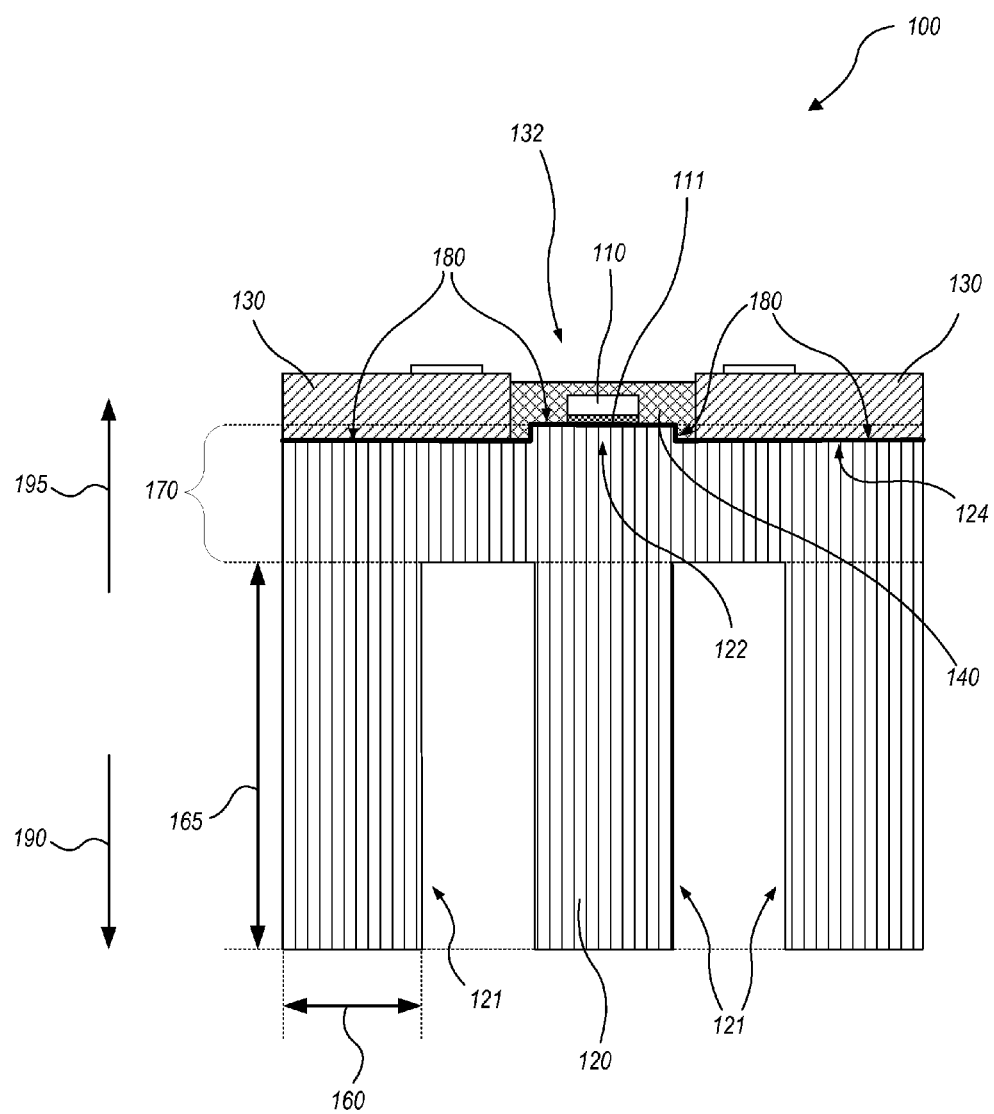
FIG. 12 further illustrates geometric relationships among portions of the LED assembly of FIG. 1.

FIG. 12 further illustrates geometric relationships among portions of LED assembly 100 (also see FIG. 1). In FIG. 12, LED assembly 100 is shown without bond wires and without certain labels as compared to its depiction in FIG. 1, for clarity of illustration. As noted above, a "heat sink" is defined herein as a monolithic structure formed of a good or excellent thermal conductor, that includes a base portion having a mounting area for components, and at least two fins extending perpendicularly from the base portion in a direction opposite from the mounting area, for dissipating heat generated by the components to ambient air. In FIG. 12, heat sink 120 is shown as having a base portion 170 with three fins 121 extending perpendicularly from base portion 170. Base portion 170 extends across heat sink 120. A mounting area 180 is identified with a heavy line on one side of base portion 170 and includes planar surfaces 124, and upper and outer surfaces of pedestal 122, as identified in FIG. 1. A direction identified as arrow 195 is defined as the direction of the mounting area, and a direction identified as arrow 190 is defined as the direction opposite from the mounting area. Each fin 121 has a length 165 that extends away from base portion 170, and a width 160. An aspect ratio of length 165 to width 160 is greater than 2:1, with the major dimension of each fin (e.g., length 165) extending away from the base portion.

Figure 13:
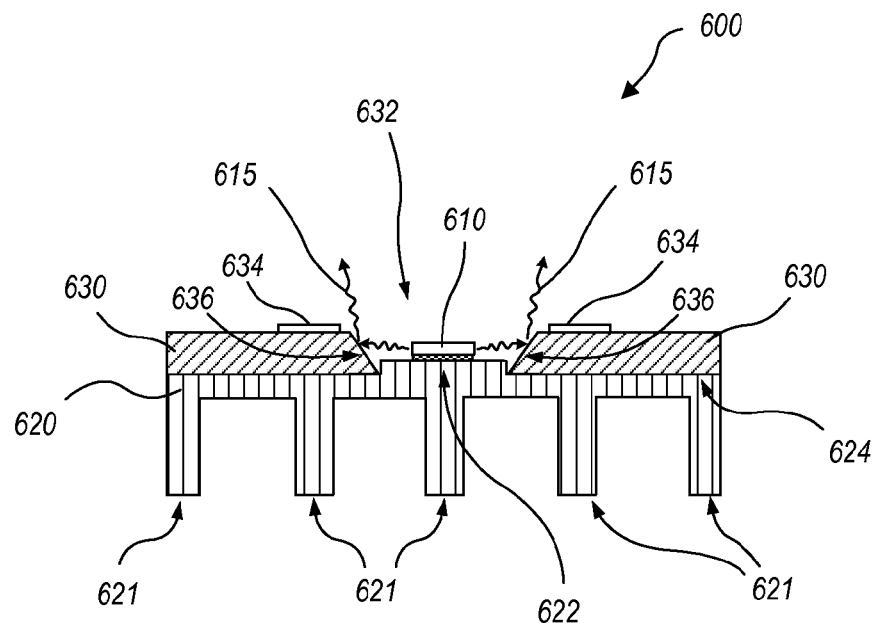
FIG. 13 is a cross-sectional view illustrating a light emitting diode (LED) assembly having features to improve light extraction, in an embodiment.
Figure 14:
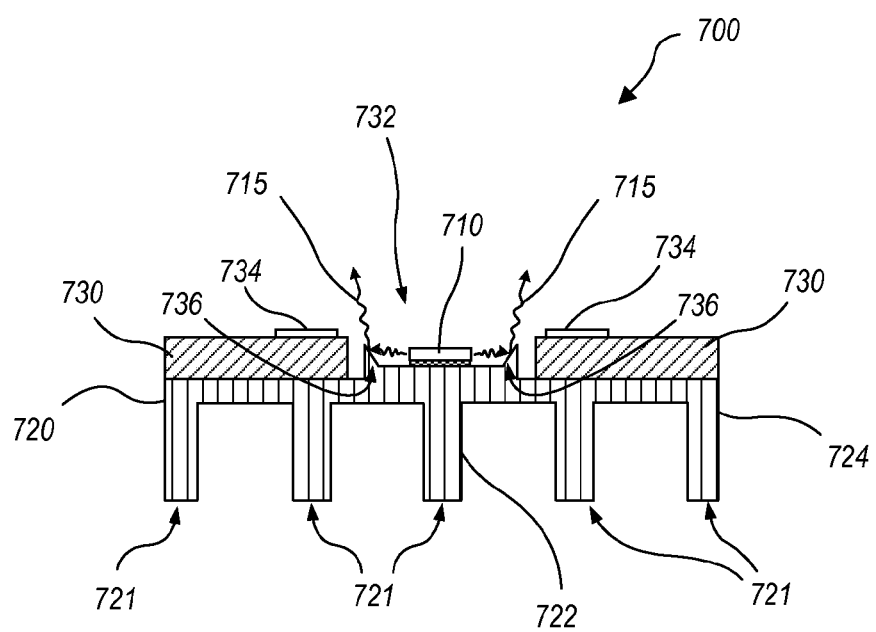
FIG. 14 is a cross-sectional view illustrating a light emitting diode (LED) assembly having features to improve light extraction, in an embodiment.

FIGS. 13 and 14 are cross-sectional views illustrating embodiments of light emitting diode (LED) assemblies having features to improve light extraction. It is known that LEDs may emit light in various directions; the features discussed below improve the net light output of an LED assembly as compared to prior art assemblies that may absorb a portion of the emitted light.

In FIG. 13, LED assembly 600 includes LED chips 710 mounted upon a heat sink 620. Heat sink 620 is formed of a good or excellent thermal conductor, and includes five integrally formed fins 621 extending downwardly from a base portion of the heat sink. A major dimension of each fin 621 is in a vertical direction, and an aspect ratio of each fin 621 is about 2.6:1. Heat sink 620 includes a pedestal 622 integrally formed on the base portion, upon which LED chips 610 mount. Pedestal 622 may be raised or offset in the vertical direction with respect to a planar surface 624 of heat sink 620. LED assembly 600 also includes a printed circuit board (PCB) 630 that forms apertures 632 therethrough, corresponding to each pedestal 622. PCB 630 attaches to planar surface 624 with adhesives, or mechanically. PCB 630 also includes electrical conductors 634 on an upper surface thereof. LED chips 610 are connected to conductors 634, and may be protected with encapsulation materials such as discussed above, but such connections and materials are not shown and/or labeled in FIG. 13 for clarity of illustration.

PCB 630 forms reflective surfaces 636 at aperture 632 to reflect light 615 from chip 610 that reaches surfaces 636. Surfaces 636 may form non-vertical slopes, as shown in FIG. 13, such that light 615 reflects upwardly, as shown. The reflectivity and angle of surfaces 636 therefore help extract light 615 as compared with prior art assemblies that may absorb such light, undesirably turning it into heat (which must, in turn, be removed for performance and reliability reasons).

In FIG. 14, LED assembly 700 includes LED chips 710 mounted upon a heat sink 720. Heat sink 720 is formed of a good or excellent thermal conductor, and includes integrally formed fins 721 similar to those shown in FIG. 13. Heat sink 720 includes a pedestal 722 integrally formed on the base portion, upon which LED chips 710 mount. LED assembly 700 also includes a printed circuit board (PCB) 730 that forms apertures 732 therethrough, corresponding to each pedestal 722. PCB 730 attaches to planar surface 724 with adhesives, or mechanically. PCB 730 also includes electrical conductors 734 on an upper surface thereof. LED chips 710 are connected to conductors 734, and may be protected with encapsulation materials such as discussed above, but such connections and materials are not shown and/or labeled in FIG. 14 for clarity of illustration.

Pedestal 722 may be raised or offset in the vertical direction with respect to a planar surface 724 of heat sink 720. Pedestal 722 forms non-vertical, reflective surfaces 736, as shown in FIG. 14, such that light 715 reflects upwardly, as shown. The reflectivity and angle of surfaces 736 therefore help extract light 715.

In embodiments, non-vertical surfaces of a heat sink, as shown in FIG. 14, may be combined with reflective and/or non-vertical surfaces of a PCB, as shown in FIG. 13, to further increase light extraction from an LED assembly.

Figure 15A:
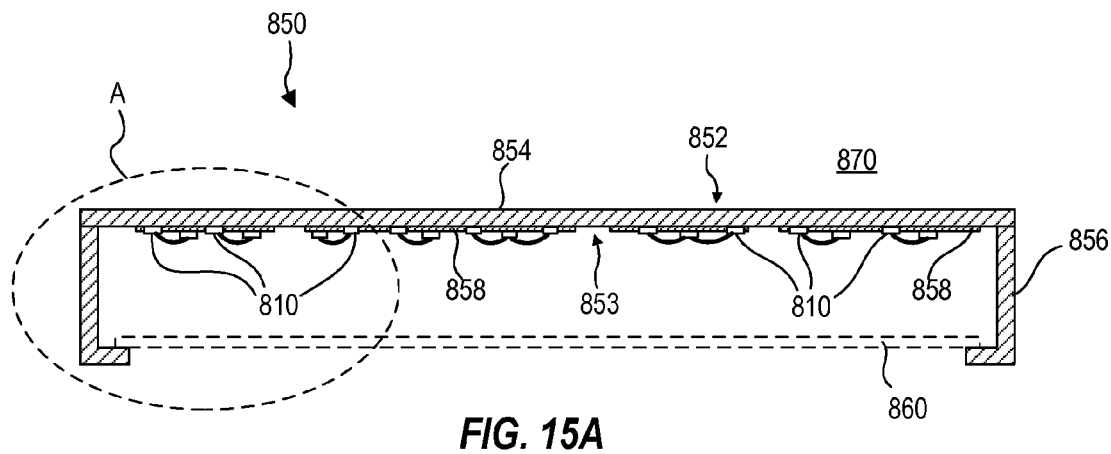
FIGS. 15A, 15B and 15C are cross-sectional views of an LED chip-based lighting product, in an embodiment.

FIG. 15A is a cross-sectional view of LED chip-based lighting product 850. Lighting product 850 includes a panel 854 having a first surface 853 and a second surface 852, counterfacing first surface 853. A dielectric layer 858 covers a portion of first surface 853, and forms apertures therethrough. LED chips 810 are shown mounted in the apertures of dielectric layer 858 on first surface 853 of panel 854. LED chips 810 are operatively connected to power supplies through conductors on dielectric layer 858, however for clarity of illustration the power supplies are not shown, and the conductors and connections from LED chips 810 to the conductors are not labeled within FIGS. 15A-15C. A frame 856 attaches to panel 854 and holds an optional diffuser 860. Second surface 852 of panel 854, counterfacing first surface 853, is an external surface of lighting product 850 and is in thermal communication with ambient air 870. The term "ambient air" herein denotes air entirely outside a lighting product, and excludes air within enclosed cavities of the lighting product. In the embodiment of FIG. 15A, all of second side 852 forms an external surface of lighting product 850; however in other embodiments an external surface may be formed by only a portion of a second side of a panel. A region within LED chip-based lighting product 850 is denoted as A and is described in further detail below.

Figure 15B:
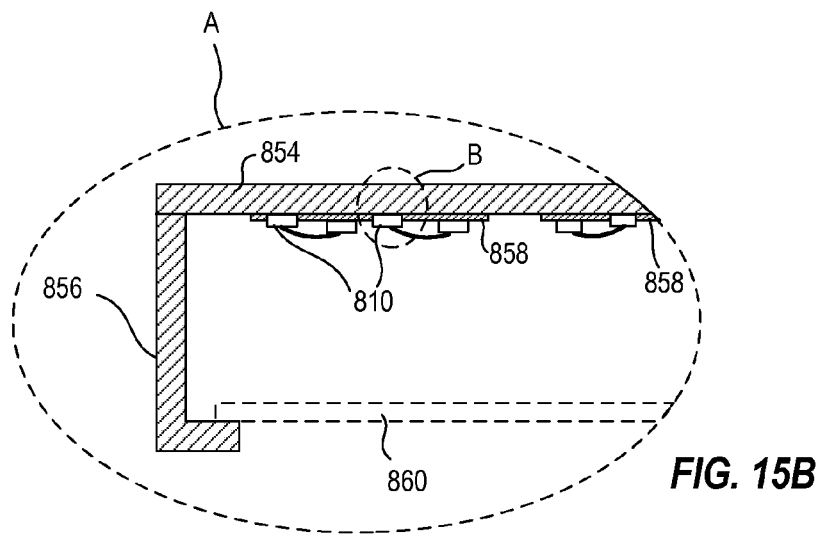

FIG. 15B is a detail view of region A shown in FIG. 15A. A region within region A is denoted as B and is described in further detail below.

Figure 15C:
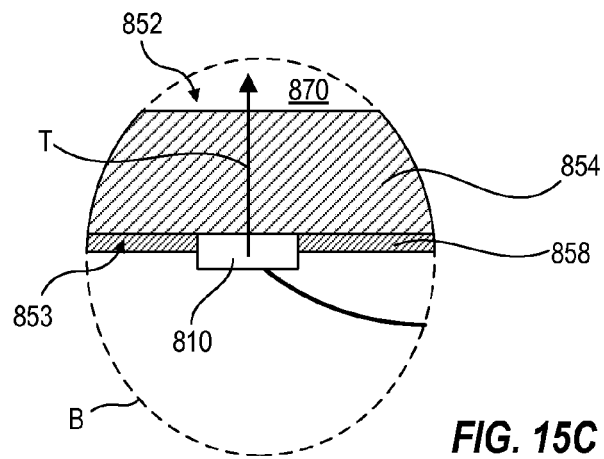

FIG. 15C is a detail view of region B shown in FIG. 15B and shows LED chip 810 mounted within an aperture formed in dielectric layer 858 formed on first surface 853 of panel 854. An arrow T illustrates an LED-backside direct thermal interface from LED chip 810 that extends perpendicularly through mounting surface 872, conductor 858 and panel 854 to ambient air 870. The term "LED-backside direct thermal interface" herein, when used in connection with an LED chip, denotes an arrangement of at most one panel and intervening mounting materials (e.g., solder, epoxy or adhesive) that extends perpendicularly from a backside of the LED chip to ambient air. An LED-backside direct thermal interface thus excludes arrangements that require heat transfer in one or more lateral directions (any direction that is not perpendicular to the LED chip's mounting surface) to reach ambient air, and arrangements that transfer heat from an LED to enclosed cavities. Used in connection with a packaged LED, the term "LED direct thermal interface" denotes a similar arrangement of at most one panel and intervening mounting materials (e.g., solder, epoxy or adhesive) that extends perpendicularly away from a light emitting side of the packaged LED to ambient air.

The changes described above, and others, may be made in the LED assemblies, lighting products and methods described herein without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A light emitting diode (LED)-based lighting assembly, comprising:
    a heat sink configured with an extruded ridge that extends vertically from a planar surface of the heat sink;
    a printed circuit board (PCB) that includes electrical conductors on an upper surface thereof, the PCB being attached to the planar surface; and
    one or more LED chips, each of the LED chips being (a) attached directly to the ridge and (b) electrically connected to the conductors;
    wherein a combined thickness of the extruded ridge and the one or more LED chips substantially matches a thickness of the PCB.

2. The lighting assembly of claim 1, wherein each of the LED chips is electrically connected to the conductors utilizing bond wires.

3. The lighting assembly of claim 2, the one or more LED chips comprising a plurality of LED chips, wherein at least two bond wires connect ones of the plurality of LED chips directly to the conductors, and at least one bond wire connects ones of the plurality of LED chips to one another.

4. The lighting assembly of claim 1, the PCB forming an edge that abuts the extruded ridge of the heat sink.

5. A light emitting diode (LED)-based lighting assembly, comprising:
    a heat sink having at least one pedestal integrally formed therewith, the pedestal including an upwardly facing, upper planar surface that is raised in a vertical direction relative to an upwardly facing, lower planar surface of the heat sink;

a dielectric layer forming an aperture therein corresponding to the pedestal, the dielectric layer being attached to the lower planar surface such that the upper planar surface extends into the aperture;

at least one electrical conductor formed on an upper surface of the dielectric layer; and one or more LED chips attached directly to the upper planar surface and connected to the electrical conductor such that light from the one or more LED chips emits upwardly from the upper planar surface;

wherein a combined thickness of the pedestal and the one or more LED chips substantially matches a thickness of the dielectric layer.

6. The lighting assembly of claim 5, the dielectric layer comprising one or more of epoxy, fiberglass and a polymer.

7. The lighting assembly of claim 5, the dielectric layer having a thickness of 0.1 mm to 3 mm.

* * * * *